(12) United States Patent
Chesterfield et al.

(10) Patent No.: US 9,149,830 B2
(45) Date of Patent: Oct. 6, 2015

(54) LIQUID REPLENISHMENT SYSTEM FOR A PRINTING APPARATUS FOR DEPOSITING A LIQUID COMPOSITION ON A BACKPLANE INCLUDING A DISPENSING VESSEL HAVING A SELF-SUPPORTING SECONDARY CONTAINER

(71) Applicant: E I DU PONT DE NEMOURS AND COMPANY, Wilmington, DE (US)

(72) Inventors: Reid John Chesterfield, Wilmington, DE (US); Matthew Stainer, Goleta, CA (US); James Daniel Tremel, Santa Barbara, CA (US); Nugent Truong, Ventura, CA (US)

(73) Assignee: E I DU PONT DE NEMOURS AND COMPANY, Wilmington, DE (US)

(*) Notice: Subject to any disclaimer, the term of this patent is extended or adjusted under 35 U.S.C. 154(b) by 0 days.

(21) Appl. No.: 14/270,753

(22) Filed: May 6, 2014

(65) Prior Publication Data
US 2014/0326333 A1    Nov. 6, 2014

Related U.S. Application Data

(60) Provisional application No. 61/819,897, filed on May 6, 2013.

(51) Int. Cl.
*B05C 11/10* (2006.01)
*H01L 51/00* (2006.01)

(52) U.S. Cl.
CPC .......... *B05C 11/101* (2013.01); *H01L 51/0005* (2013.01); *Y10T 137/7287* (2015.04)

(58) Field of Classification Search
CPC .... B05C 11/101; B05C 11/10; H01L 51/0005
See application file for complete search history.

(56) References Cited

U.S. PATENT DOCUMENTS

| | | | | |
|---|---|---|---|---|
| 4,893,738 A * | 1/1990 | Gelinas | | 222/380 |
| 5,473,350 A | 12/1995 | Mader et al. | | |
| 6,935,729 B2 * | 8/2005 | De Marco et al. | | 347/73 |
| 7,401,052 B2 * | 7/2008 | Lyman | | 705/50 |
| 7,594,717 B2 * | 9/2009 | Sheinman | | 347/89 |

* cited by examiner

*Primary Examiner* — Manish S Shah
*Assistant Examiner* — Jeremy Delozier

(57) ABSTRACT

A liquid replenishment system includes a dispensing vessel for holding a supply of a liquid that has an outer can and corresponding lid conjoinable to the outer can in an air-tight manner. The dispensing vessel is improved by the provision of a separate self-supporting secondary inner container removably receivable within the outer can. The container is fabricated of a material that is non-reactive with a liquid composition containing an organic semiconductor material, such as a polytetrafluoroethylene material or stainless steel.

6 Claims, 1 Drawing Sheet

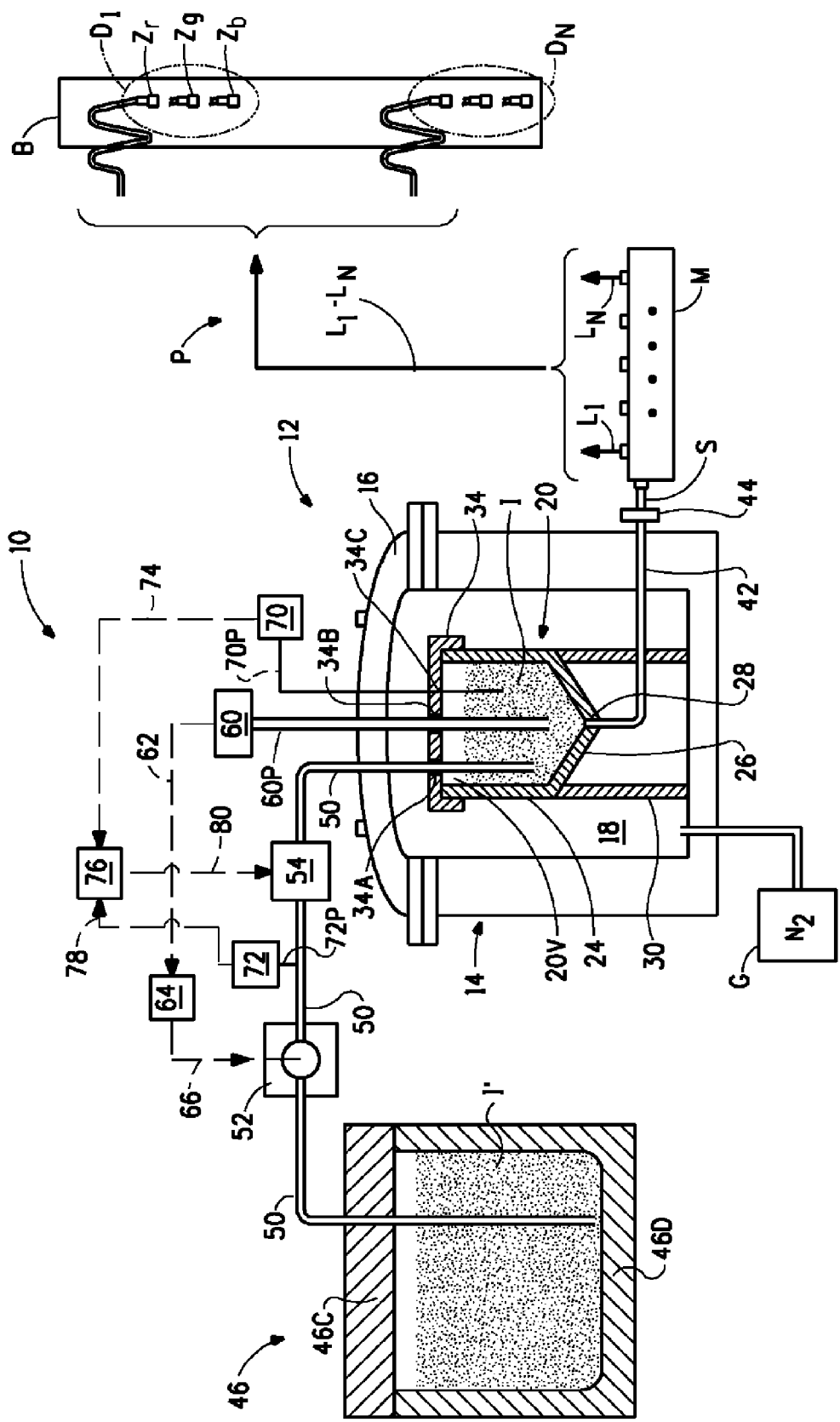

US 9,149,830 B2

LIQUID REPLENISHMENT SYSTEM FOR A PRINTING APPARATUS FOR DEPOSITING A LIQUID COMPOSITION ON A BACKPLANE INCLUDING A DISPENSING VESSEL HAVING A SELF-SUPPORTING SECONDARY CONTAINER

CLAIM OF PRIORITY

This application claims priority from the following United States Provisional Application, which is hereby incorporated by reference:

System and Process For Liquid Replenishment For A Printing Apparatus For Depositing A Liquid Composition On A Backplane, Application Ser. No. 61/773,532 filed 6 Mar. 2013.

CROSS REFERENCE TO RELATED APPLICATIONS

Subject matter disclosed herein is disclosed in the following copending application, filed contemporaneously herewith and assigned to the assignee of the present invention:

Dispensing Vessel Having A Corrugated Secondary Container For Use In A Printing Apparatus For Depositing A Liquid Composition On A Backplane, U.S. patent application Ser. No. 14/265,871;

Liquid Replenishment System For A Printing Apparatus For Depositing A Liquid Composition On A Backplane Including A Dispensing Vessel Having A Corrugated Secondary Container, U.S. patent application Ser. No. 14/265,895; and Dispensing Vessel Having A Self-Supporting Secondary Container For Use In A Printing Apparatus For Depositing A Liquid Composition On A Backplane, U.S. patent application Ser. No. 14/270,734.

BACKGROUND OF THE INVENTION

1. Field of the Invention

This invention relates to a printing apparatus for depositing a liquid composition on a surface, such as the depositing of a liquid composition containing an organic semiconductor material on a backplane, and particularly to a system for replenishing the supply of the liquid composition and, in another particular aspect, to a dispensing vessel having a self-supporting secondary container for storing a supply of the liquid composition.

2. Description of the Related Art

Organic electronic devices utilizing organic active materials are used in many different kinds of electronic equipment. The term "organic electronic device" is intended to mean a device, such as an organic light emitting diode (OLED), that includes one or more layers of organic semiconductor materials laminated between other supporting layers and sandwiched by two electrodes.

Current manufacture of organic electronic devices utilizes a vapor phase deposition process to deposit organic semiconductor materials. However, vapor phase deposition is believed to be disadvantageous owing to its poor utilization of materials. In vapor phase deposition a mask is used to control precise deposition of each layer of organic semiconductor material. The open areas of the mask allow material to adhere to desired areas of the underlying substrate. However, the solid portions of the mask become coated with organic semiconductor material during production of each layer and do not reach the substrate. This is seen as wasteful of the organic materials. In addition, masks must be replaced after only a few production cycles to maintain deposition quality. Scaling of the vapor phase deposition to larger electronic devices is problematic and expensive.

In view of these perceived difficulties liquid deposition of organic semiconductor materials is seen as an advantageous alternative.

With liquid deposition each organic material is carried in a liquid composition. During manufacture of a device each liquid composition is dispensed from a dedicated nozzle carried by a dispensing bar. The nozzles are grouped in nozzle sets, with one nozzle in each set dispensing a particular color of ink. Each nozzle dispenses liquid and deposits that liquid along a longitudinal lane that extends across a backplane of the device. The nozzles in each set continuously dispense a liquid composition into a respective lane as the bar traverses the backplane.

The individual nozzles for each particular color in each nozzle set are supplied as a group from a common manifold itself supplied from a suitable nozzle supply source, or supply reservoir. The supply reservoir for each particular color is usually implemented using a communal dispensing vessel. The dispensing vessel may either directly hold a supply of liquid for the nozzles or may hold a secondary container, such as a sealed pouch containing the particularly colored liquid composition.

The dispensing vessel used in the prior art includes an outer shell, or can, that is closed in an air-tight manner by a conjoinable lid. When conjoined the can and lid cooperate to define an enclosed interior chamber. The interior chamber of the vessel contains an inert gas (e.g., nitrogen) that is held at a predetermined pressure above atmospheric pressure, typically a pressure level on the order of one hundred thirty pounds/square inch (130 psi; 0.9 MPa). The pressure of the inert gas in the interior chamber forces liquid from the outer can or from the secondary container to the manifold, and from the manifold, through a dedicated flow line to a nozzle.

The holding capacity of the dispensing vessel or the secondary container is limited, requiring that liquid ink in the dispensing vessel or the secondary container be replenished as the liquid ink is consumed by the nozzles. Several factors serve to complicate ink replenishment.

Currently, replenishing ink in the supply reservoir requires a shut-down of the printer and termination of nozzle discharge. The dispensing vessel is depressurized and its lid removed. With the lid removed the dispensing vessel is recharged or the secondary container, if one is used, is either replaced or refilled. Once the dispensing vessel is replenished with liquid the lid is re-attached and the pressure vessel re-pressurized.

This arrangement and method for replenishing liquid is believed disadvantageous for several reasons.

On a system level care must be exercised to minimize the potential of nozzle failure due to plugging, which is more probable to occur during startup/shutdown phases than during steady operation of the system. The more often nozzles are turned off the greater is the chance for nozzle failure. Moreover, after starting a nozzle it takes a significant amount of time for the system to reach a steady flow rate. During this time ink discharged from the nozzle is not useable and is wasted.

The act of replacing or refilling of the secondary vessel if one is used (e.g., a pouch) involves additional specific challenges beyond the disadvantages caused by the time-consuming disconnection and re-connection of the pouch to its associated manifold. These challenges include maintaining the pouch's structural integrity, avoiding gas entrapment in any supply lines, avoiding the introduction of atmospheric gases into the pouch, and monitoring the volume of liquid introduced into the back to prevent overfill and potential rupture of the pouch.

U.S. Pat. No. 5,473,350 (Mader et al.) discloses a system and method for maintaining ink concentration in a printing system. However, in the system disclosed in this patent it appears that the main ink supply reservoir is maintained under partial vacuum, rather than at a pressure greater than atmospheric pressure.

In view of the foregoing it is believed advantageous to provide a system and process for continuously replenishing a liquid composition in a secondary container in the dispensing vessel serving as the nozzle supply source without requiring disconnection or de-pressurization. It is also believed to be advantageous to provide a supply reservoir implemented using a dispensing vessel with an improved form of secondary container therein which minimizes the possibility of driving gas dissolution into the liquid composition.

SUMMARY OF THE INVENTION

The present invention is directed to a replenishment system for replenishing liquid to a nozzle supply reservoir operable to supply a liquid to a dispensing nozzle for depositing the liquid on a surface, and to an improved dispensing vessel that serves as the supply reservoir for the system. The replenishment system supplies liquid to the dispensing vessel at a predetermined pressure above atmospheric pressure.

The improved dispensing vessel has an outer shell, or can, that is closed in an air-tight manner by a conjoinable lid. When conjoined the can and lid cooperate to define an enclosed chamber. A separate, rigid, self-supporting secondary container is removably receivable within the outer can. The self-supporting inner container has a top portion and a closed bottom portion with the closed bottom portion having an outlet port defined therein. The container is fabricated of a material that is non-reactive with a liquid composition containing an organic semiconductor material, such as a polytetrafluoroethylene material or stainless steel. The closed bottom portion of the container is conical in shape, with the outlet port being disposed at the apex of the cone. A support skirt for supporting the container within the outer can is connected to the top portion and disposed in surrounding relationship to the conical bottom portion. A cover may be provided over the top portion of the container thereby to close the same in a non-air-tight manner such that the container is in fluid communication with the interior of the outer can. A volume sensor is operable to generate a signal representative of the volume of liquid within the secondary container.

The replenishment system includes a volume control network is operably associated with the volume sensor and responsive thereto generates a volume control signal that is applied to a pump. The pump is operable to inject replenishment liquid drawn from a liquid replenishment source into the secondary container. The replenishment liquid is injected at a pressure at least substantially equal to the pressure of the liquid held in the secondary container and at a flow rate selectable in accordance with the volume control signal such that the volume of liquid in the secondary container is maintained at a predetermined reference level.

BRIEF DESCRIPTION OF THE DRAWINGS

The invention will be more fully understood from the following detailed description, taken in connection with the accompanying drawing, which forms a part of this application and in which:

FIG. 1 is a highly stylized pictorial representation illustrating a liquid replenishment system for continuously replenishing liquid to a supply reservoir of a printing apparatus, the system including an improved dispensing vessel having a self-supporting secondary container in accordance with one aspect of the present invention.

DETAILED DESCRIPTION OF THE INVENTION

FIG. 1 is a highly stylized pictorial representation of a system generally indicated by the reference character 10 for continuously replenishing a supply source, or supply reservoir, supplying a liquid to dispensing nozzles in a printing apparatus, such as a printing apparatus useful to dispense a liquid composition onto the backplane of an organic electronic device. The nozzle supply source is generally indicated by the reference character 12 and is implemented using a pressurizable dispensing vessel 14 structured in accordance with an aspect of the present invention.

The printing apparatus is generally indicated by the reference character P. Elements of the printing apparatus P common to the prior art are indicated herein by alphabetic reference characters. The printing apparatus is useful in the fabrication of various organic electronic devices, and is believed to be especially useful to fabricate screens for variously sized display devices, including high density display devices.

The printing apparatus P includes a dispensing bar B that carries N sets of dispensing nozzles, respectively indicated by the reference characters $D_1, \ldots D_N$. Typically, a bar may carry five or more nozzle sets. Each nozzle set includes a separate nozzle that discharges one of a plurality of different colored liquid compositions. Typically, each nozzle set D may contain a nozzle $Z_r$, $Z_g$, and $Z_b$ respectively dispensing a red, a green and a blue liquid composition.

The nozzle in each nozzle set for a given color, e.g., the nozzles $Z_r$ in the nozzle sets $D_1, \ldots D_N$, are supplied from a common manifold M. Thus, for example, each red nozzle $Z_r$ is supplied over a dedicated line $L_1, \ldots L_N$ from the common manifold $M_r$. Similar plumbing is provided for the nozzles for the other colors such as the manifolds $M_g$ and $M_b$, as the case may be. Each manifold $M_r$, $M_g$, and $M_b$ is itself supplied over a supply line S from its dedicated dispensing vessel 14.

The dispensing vessel 12 in accordance with the present invention is implemented as a nested, two-stage structural arrangement comprised of an outer pressurized can 14 closed in an air-tight manner by a conjoinable lid 16. When conjoined the can 14 and lid 16 cooperate to define an enclosed interior chamber 18. The can 14 and the lid 16 as described are similar to the members used to form a dispensing vessel in the prior art.

In use, the interior chamber 18 has an pressurized inert fluid, such as nitrogen gas, therein. The gas is held at a predetermined pressure above atmospheric pressure. Typically the pressure level within the chamber 18 is on the order of one hundred thirty pounds/square inch (130 psi; 0.9 MPa). Details of the gas supply arrangement G (including any appropriate pressure relief elements) are not shown in FIG. 1 for economy of illustration.

The dispensing vessel 12 in accordance with the present invention is believed improved by the provision of a separate self-supporting secondary container 20 removably receivable within the interior chamber 18. The secondary container 20 includes a top portion 24 and a closed bottom portion 26.

The closed bottom portion 26 has an outlet port 28 defined therein. The container 20 may exhibit any desired shape. Preferably, the top portion 24 of the container 20 is substantially cylindrical in form, with the closed bottom portion 26 being conical. The outlet port 28 is positioned at any convenient location, such as the apex of the cone.

A support skirt portion 30 is connected at the lower edge of the top portion 24 in surrounding relationship to the conical bottom portion 26. The skirt 30 supports the container 20 within the chamber 18. A cover 34 may be disposed over the top portion 24. The cover 34 is secured in a non-air-tight manner such that the interior volume 20V of the container 20 is in fluid communication with the interior chamber 18. Access openings 34A, 34B, and 34C are provided through the cover 34 to afford access to the interior volume 20V for purposes to be described.

The liquid composition, or ink, I to be supplied to the manifold M and then to the nozzles is held in the interior volume 20V of the secondary container 20. In use, the liquid ink I exhibits a temperature and pressure profile determined by the temperature and pressure extant within the chamber 18 of the dispensing vessel 14.

To prevent contamination of the ink I the top and bottom portions 24, 26 of the container 20 are fabricated of a material that is non-reactive with the solvents and other materials forming the ink. Suitable inert materials of construction for these portions of the container 20 are polytetrafluoroethylene (PTFE) or stainless steel. Preferably, the various portions of the secondary container are fabricated as an integral unit in any convenient manner, as by molding, machining or other industry standard methods for creating monolithic PTFE pieces. The container may have any convenient shape and cross section.

Since the cover 34 does not seal completely the interior volume 20V, the pressure of the inert gas in the interior chamber 18 is able to act upon the liquid I and force the same from the container 20 into an outlet line 42. However, owing to the presence of the cover 34, exposure of the liquid composition to the environment within the chamber 18 is minimized, reducing the probability of foreign material, such as dust, enters the liquid composition. The line 42 passes in an air-tight manner through the wall of the outer can 14 where it is connected by a fitting 44 to the supply line S leading to the manifold.

The replenishment system 10 is operable to continuously and automatically replenish the supply of ink I in the container 20. To this end the replenishment system 10 includes a receptacle 46 that serves as a source of replenishment liquid I'. In the embodiment illustrated the receptacle 46 is implemented in the form of a drum 46D closed in an air-tight manner by an associated cap 46C. The interior of the receptacle 46 is typically at ambient temperature (i.e., temperature of the local environment) and at atmospheric pressure.

Replenishment liquid flow from the receptacle 46 is carried to the container 20 by a supply line 50. Opposite respective ends of the line 50 extend in a sealed manner through the cap 46C and the cover 16. The supply line 50 passes freely through the opening 34A in the cover 34 of the secondary container 20 into fluid communication with the interior volume 20V. A pump 52 and a heat exchanger 54 are connected in the supply line 50 for purposes to be described.

Suitable for use as the pump is a high pressure liquid chromatography piston-type injection pump such as the Prep 100 Preparative Digital Pumps available from Chrom Tech, Inc., Apple Valley, Minn. This pump is controllable for flow rates in the range from 0.1 to 100 mL/min at pressures up to 4,000 psi. Other pump designs, such as a diaphragm pump or a gear pump may also be suitable. Whatever the form of pump used, it is important that the internal parts of the pump that are contacted by the replenishment liquid are fabricated from a non-elastomeric material, such as stainless steel, polytetrafluroethylene or sapphire.

The probe 60P of a volume monitoring device, or volume sensor 60, extends in a sealed manner through the cover 16 and freely through the opening 34B in the cover 34 into the interior volume 20V of the container 20. The sensor 60 is operable to monitor the volume of liquid in the secondary container 20 of the dispensing vessel 14 as the same is being depleted by the nozzles. The sensor 60 generates a signal representative of the volume of liquid I that is applied over a line 62 to a volume control network 64. The volume monitoring device 60 may be implemented using a liquid level sensor such as a capacitance point level switch such as that available from Endress and Hauser, Greenwood, Ind. as the "Liquicap M".

In use, the volume control network 64 responds to the signal from the volume sensor 60 by generating a volume control signal that is output over a line 66 to the replenishment pump 52. The pump 52 draws replenishment liquid from the receptacle 46 and injects that replenishment liquid into the secondary container 20 at a pressure at least substantially equal to the pressure of the liquid in the container 20. The control network 64 selectably modifies the flow rate of replenishment liquid drawn by the pump 52 such that the volume of liquid in the container 20 is maintained at a predetermined desired reference level.

The volume control network 64 may be implemented using a programmable logic controller such as that available from Galil Motion Control, Rocklin, Calif. as "RIO047200".

The controller implements implementing a proportional integral/differential algorithm.

The replenishment system 10 may further include a replenishment liquid temperature control system that includes temperature sensors 70, 72. The sensors respectively monitor the temperature of the liquid I in the container 20 and the temperature of the replenishment liquid I' being supplied thereto. In the arrangement illustrated in FIG. 1 the probe 70P from the sensor 70 extends in a sealed manner through the cover 16 and freely through the opening 34C provided in the cover 34. The sensor 70 is operable to monitor the temperature of the liquid I held in the container 20 and provide a signal representative of the same over a line 74 to a temperature control network 76. Similarly, the probe 72P of the temperature sensor 72 is disposed to monitor the temperature of the replenishment liquid I' in the line 50 and provide a signal representative thereof to the network 76 over a line 78. The sensors 70, 72 may be disposed in the system in any convenient alternative locations. Suitable for use as each temperature sensor is a high precision resistance temperature device element.

In use, the temperature control network 76 compares a signal representative of the temperature of a liquid I within the container 20 to a signal representative of the temperature of a replenishment liquid I' and generates a temperature control signal when the comparison indicates that the temperature of the replenishment liquid I' differs from the temperature the liquid I by a predetermined amount. The temperature signal is applied over a line 80 to the heat exchanger 54.

The heat exchanger 54 responds to the temperature control signal to adjust the temperature of replenishment liquid I' injectable by the pump 52 to a temperature that lies within a predetermined range of the temperature of the liquid I in the container 20.

Although shown in the drawing as being disposed between the pump and the container 20, it should be understood that the heat exchanger 54 may be connected at any convenient position within the system 10. The heat exchanger 54 may be implemented using, for example, a thermoelectric heating/cooling module or an electric resistance heater.

It should be appreciated from the foregoing description that the present invention serves to continuously replenish liquid to the supply reservoir 12 such that the volume of liquid therein is maintained at a predetermined reference level without the necessity of having to interrupt printing operation. Coordinated with the use of the temperature control arrangement herein described the injection of replenishment liquid into the secondary container is effected without undue disturbance of the ambient temperature and pressure profile of the liquid therewithin. The self-supporting secondary container within the dispensing vessel 12 acts as a phase separator that permits the escape of any gas that becomes entrained in the liquid I. In addition, due to the presence of the cover, exposure of the liquid composition to the environment within the pressure chamber is minimized, reducing the probability of foreign material, such as dust, entering the liquid composition.

Those skilled in the art, having the benefit of the teachings of the present invention, may impart modifications thereto. Such modifications are to be construed as lying within the scope of the present invention, as defined by the appended claims.

What is claimed is:

1. A liquid replenishment system for replenishing liquid in a dispensing vessel for supplying liquid to a printing apparatus for depositing a liquid on a surface, the liquid replenishment system comprising:
　a receptacle for storing a replenishment liquid;
　a volume sensor operable to generate a signal representative of the volume of liquid within the dispensing vessel;
　a volume control network operably associated with the volume sensor and responsive to the volume signal therefrom for generating a volume control signal; and
　a pump responsive to the volume control signal, the pump being operable to inject the replenishment liquid from the receptacle into the dispensing vessel at a pressure at least substantially equal to the pressure in the dispensing vessel and at a flow rate selectable in accordance with the volume control signal such that the volume of liquid in the dispensing vessel is maintained at a predetermined reference level, wherein the replenishment liquid and the liquid in the dispensing vessel are the same; and wherein dispensing vessel itself comprises:
　a outer can and corresponding lid, the lid being conjoinable to the outer can in an air-tight manner,
　when conjoined the can and lid cooperating to define an enclosed chamber;
　a rigid, self-supporting secondary inner container removably receivable within the outer can, the container having a top portion and a closed bottom portion, the closed bottom portion having an outlet port defined therein,
　the container being fabricated of a material that is non-reactive with a liquid composition containing an organic semiconductor material.

2. The liquid replenishment system of claim 1 wherein the container is fabricated from a polytetrafluoroethylene material.

3. The liquid replenishment system of claim 1 wherein the container is fabricated from stainless steel.

4. The liquid replenishment system of claim 1 wherein the closed bottom portion of the container is conical in shape, with the outlet port being disposed at the apex of the cone.

5. The liquid replenishment system of claim 4 wherein the container further includes a support skirt for supporting the container within the outer can, the skirt connected to the top portion and disposed in surrounding relationship to the conical bottom portion.

6. The liquid replenishment system of claim 5 wherein the container further comprises a cover receivable over the top portion of the container thereby to close the same in a non-air-tight manner such that the container is in fluid communication with the interior of the outer can.

\* \* \* \* \*